US010297558B1

(12) United States Patent
Shieh et al.

(10) Patent No.: US 10,297,558 B1
(45) Date of Patent: May 21, 2019

(54) TRIMMING METHOD, TRIMMING CIRCUITY, AND TRIMMING SYSTEM FOR INTEGRATED CIRCUIT WITH MEMORY USAGE REDUCTION

(71) Applicant: Novatek Microelectronics Corp., Hsinchu (TW)

(72) Inventors: Tzong-Honge Shieh, Hsinchu County (TW); Po-Hsiang Fang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/839,813

(22) Filed: Dec. 12, 2017

(51) Int. Cl.
| | |
|---|---|
| G06F 3/06 | (2006.01) |
| G06F 12/00 | (2006.01) |
| G11C 16/08 | (2006.01) |
| G01P 21/00 | (2006.01) |
| G11C 5/00 | (2006.01) |
| H03L 7/00 | (2006.01) |
| G11C 16/06 | (2006.01) |
| H01L 35/00 | (2006.01) |
| H01L 23/58 | (2006.01) |
| H01L 21/66 | (2006.01) |
| H01L 23/525 | (2006.01) |
| G11C 17/16 | (2006.01) |

(52) U.S. Cl.
CPC ............ *H01L 23/58* (2013.01); *G11C 17/165* (2013.01); *H01L 22/22* (2013.01); *H01L 23/5256* (2013.01)

(58) Field of Classification Search
CPC ..... H01L 23/58; H01L 22/22; H01L 23/5256; G11C 17/165
USPC ........................... 327/530–546; 323/312–317
See application file for complete search history.

(56) References Cited

U.S. PATENT DOCUMENTS

| | | | | |
|---|---|---|---|---|
| 7,852,099 | B1 * | 12/2010 | Clark ............... | G01R 31/31908 324/750.3 |
| 8,884,673 | B1 * | 11/2014 | Shao ......................... | H03L 7/08 327/160 |
| 9,443,582 | B2 * | 9/2016 | Jung .................. | G11C 13/0002 |
| 9,508,440 | B2 * | 11/2016 | Aritome ............... | G11C 16/102 |
| 9,779,039 | B2 * | 10/2017 | Grunzke ............. | G06F 13/1694 |
| 2008/0030259 | A1 * | 2/2008 | Scheuerlein ............ | G01K 7/01 327/513 |

(Continued)

*Primary Examiner* — Brandon S Cole
(74) *Attorney, Agent, or Firm* — JCIPRNET

(57) ABSTRACT

The disclosure provides a trimming method, a trimming circuitry, and a trimming system for an IC with memory usage reduction. The method is applicable to a system including a tester, a characteristic adjustable circuit, and a trimming circuitry having a characteristic outputting circuit, a data memory, and a trim memory. The method includes the following steps. Under each condition, output signals respectively corresponding to trim settings are received from the characteristic adjustable circuit by the characteristic outputting circuit to obtain output values of the condition, a statistical parameter associated with the output values of the condition is calculated by the tester. The statistical parameter of at least one of the conditions is written into the data memory by the tester. An optimal trim setting of the characteristic adjustable circuit is determined according to the statistical parameters under all the conditions and written into the trim memory by the tester.

19 Claims, 4 Drawing Sheets

(56) References Cited

U.S. PATENT DOCUMENTS

| | | | |
|---|---|---|---|
| 2014/0009374 A1* | 1/2014 | Yamamoto | H03K 5/084 |
| | | | 345/89 |
| 2017/0186472 A1* | 6/2017 | Jan | G11C 11/1673 |
| 2017/0194053 A1* | 7/2017 | Micheloni | G11C 16/14 |
| 2017/0352395 A1* | 12/2017 | Jan | G11C 29/44 |
| 2018/0003734 A1* | 1/2018 | Dar | G01P 21/00 |
| 2018/0090214 A1* | 3/2018 | Yamaguchi | G11C 16/08 |

* cited by examiner

TRIMMING METHOD, TRIMMING CIRCUITY, AND TRIMMING SYSTEM FOR INTEGRATED CIRCUIT WITH MEMORY USAGE REDUCTION

TECHNICAL FIELD

The disclosure relates to a trimming technique for an integrated circuit (IC) with memory usage reduction.

BACKGROUND

Numerous types of electronic devices and components are implemented by one or more ICs, and thus it is a necessity for ICs to possess physical and electrical characteristics with a high degree of precision. However, the characteristics of ICs may fluctuate due to external factors such as temperature and manufacture variations. To compensate for such variabilities, trimming techniques have been introduced where the characteristics of ICs are altered in order to deliver the performance as promised in the IC specifications.

A common trimming approach is to measure and record particular characteristics of each IC under different operating conditions, to thereby determine an optimal trim setting, and to burn the optimal setting into a fuse so that the characteristics of each IC could be optimally maintained irrespective of different operating conditions. Nonetheless, the conventional trimming process would require additional fuse usage. The higher the degree of precision on the characteristics of each IC is specified, the more the fuse usage for recording the measurements and manufacturing cost are required.

SUMMARY OF THE DISCLOSURE

A trimming method, a trimming circuitry, and a trimming system for an IC with memory usage reduction are proposed.

According to one of the exemplary embodiments of the disclosure, the trimming method is applicable to a trimming system including a characteristic adjustable circuit, a tester, and a trimming circuitry, where the trimming circuitry is coupled to the characteristic adjustable circuit and the tester and includes a characteristic outputting circuit, a data memory, and a trim memory. The method includes the following steps. Under each condition, output signals respectively corresponding to different trim settings are outputted from the characteristic outputting circuit to obtain output values of the condition, and a statistical parameter associated with the output values of the condition is calculated by the tester based on a parametric model function. The statistical parameter of at least one of the conditions is written into the data memory by the tester. Next, an optimal trim setting of the characteristic adjustable circuit is determined according to the statistical parameters under all the conditions and written into the trim memory by the tester.

According to one of the exemplary embodiments of the disclosure, the trimming system includes a characteristic adjustable circuit, a tester, and a trimming circuitry, where the trimming circuitry is coupled to the characteristic adjustable circuit and the tester and includes a characteristic outputting circuit, a data memory, and a trim memory. Under each condition, the characteristic outputting circuit outputs signals respectively corresponding to trim settings from the characteristic adjustable circuit to obtain output values of the corresponding condition, and the tester calculates a statistical parameter associated with the output values of the corresponding condition based on a parametric model function. The tester writes the statistical parameter of at least one of the conditions into the data memory. The tester also determines an optimal trim setting of the characteristic adjustable circuit according to the statistical parameters under all the conditions and writes the optimal trim setting into the trim memory.

According to one of the exemplary embodiments of the disclosure, the trimming circuitry is coupled to a characteristic adjustable circuit and a tester and includes a characteristic outputting circuit, a data memory, and a trim memory. Under each condition, the characteristic outputting circuit outputs signals respectively corresponding to trim settings from the characteristic adjustable circuit to obtain output values of the corresponding condition. The data memory is written a statistical parameter of at least one of the conditions by the tester, where the statistical parameter of each of the conditions is associated with the output values of the corresponding condition and calculated based on a parametric model function by the tester. The trim memory is written an optimal trim setting of the characteristic adjustable circuit according to the statistical parameters under all the conditions by the tester.

In order to make the aforementioned features and advantages of the present disclosure comprehensible, preferred embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also the present disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

Figure 1:
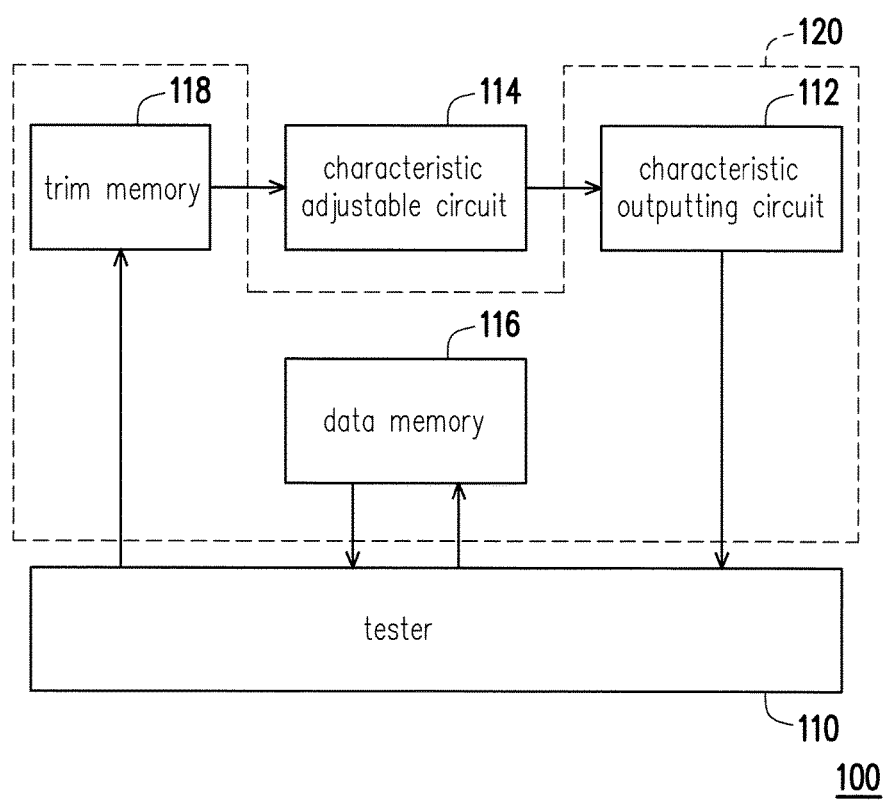
FIG. 1 illustrates a schematic diagram of a proposed trimming system in accordance with one of the exemplary embodiments of the disclosure.

To make the above features and advantages of the application more comprehensible, several embodiments accompanied with drawings are described in detail as follows.

DESCRIPTION OF THE EMBODIMENTS

Some embodiments of the disclosure will now be described more fully hereinafter with reference to the accompanying drawings, in which some, but not all embodiments of the application are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

FIG. 1 illustrates a schematic diagram of a proposed trimming system in accordance with one of the exemplary embodiments of the disclosure. All components of the system and their configurations are first introduced in FIG. 1. The functionalities of the components are disclosed in more detail in conjunction with FIG. 2.

Referring to FIG. 1, an exemplary trimming system 100 would include, but not limited to, a tester 110, a characteristic adjustable circuit 114, and a trimming circuitry 120, where the trimming circuitry 120 is coupled to the tester 110 and the characteristic adjustable circuit 114 through wires or pins.

The tester 110 may include, for example circuitry, a processor and program code stored in a memory, or the like to implement functional elements of the proposed trimming method in the following exemplary embodiments.

The trimming circuitry 120 may include, a characteristic outputting circuit 112, a data memory 116, and a trim memory 118, where the characteristic adjust circuit 114 would be coupled to the characteristic outputting circuit 112 and the trim memory 118, and the characteristic outputting circuit 112, the data memory 116, and the trim memory 118 may be coupled to the tester 110. The characteristic outputting circuit 112 would be configured to receive signals outputted from the characteristic adjustable circuit 114. The data memory 116 would be configured to store information required for calculating an optimal trim setting. In the present exemplary embodiment, the data memory 116 may be a one-time programmable memory component such as an inexpensive polyFuse. However, the data memory 116 may also be implemented using any memory technology such as eFuse, EEPROM, flash, and so forth. The trim memory 118 would be configured to store the optimal trim setting and may be implemented by any of the aforesaid memory technology or the like.

Figure 2:
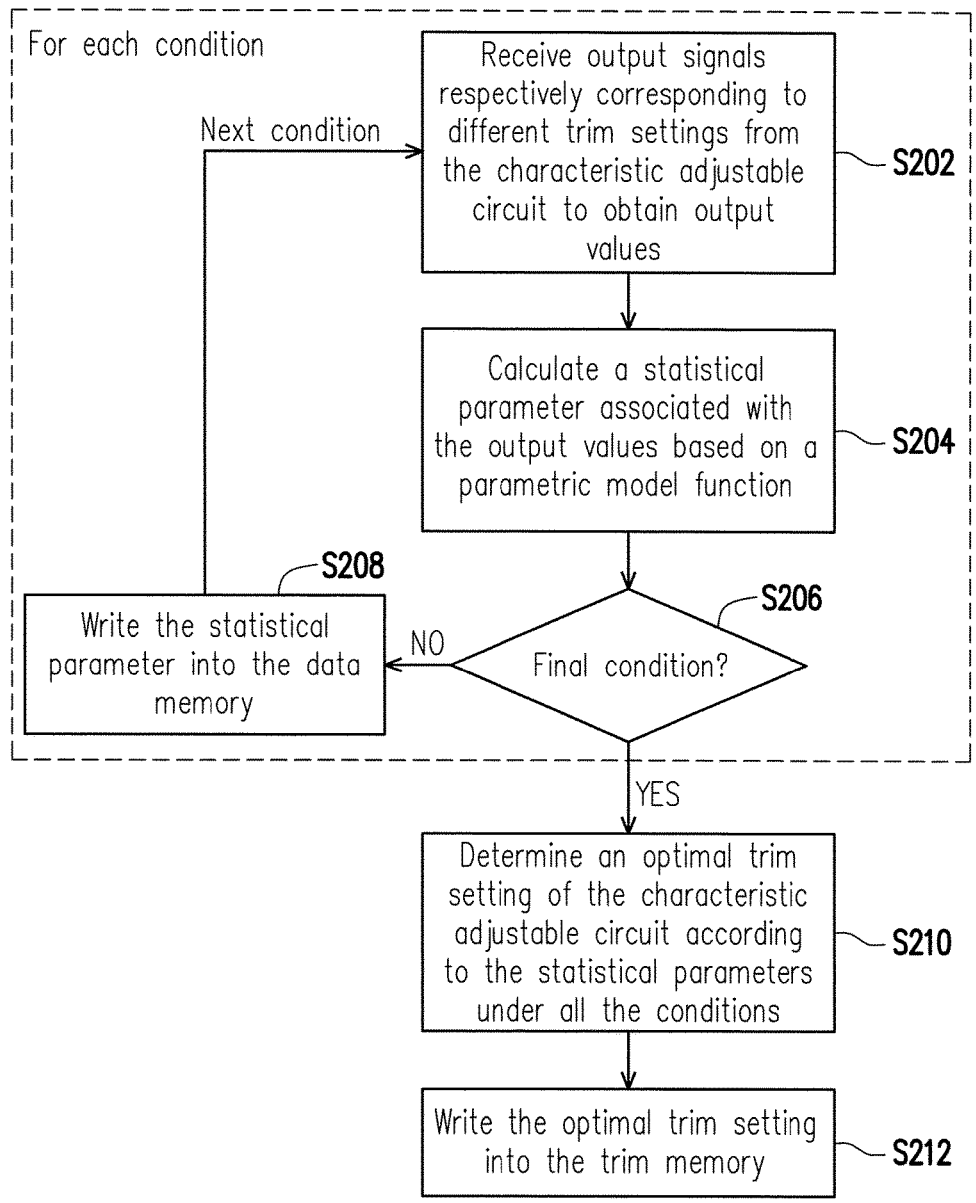
FIG. 2 illustrates a flowchart of a proposed trimming method in accordance with one of the exemplary embodiments of the disclosure.

FIG. 2 illustrates a proposed trimming method in accordance with one of the exemplary embodiments of the disclosure. The steps of FIG. 2 could be implemented by the proposed system 100 as illustrated in FIG. 1. Since electrical characteristics of circuits are susceptible to variations in temperature, manufacturing process, or other operating conditions, the implementation of the proposed method is to determine an optimal trim setting of the characteristic adjustable circuit 114 with minimal usage of the data memory 116.

Referring to FIG. 2 along with FIG. 1, the characteristic outputting circuit 112 would receive output signals respectively corresponding to different trim settings from the characteristic adjustable circuit 114 to obtain output values of the current condition (Step S202). Herein, the output values may be electrical characteristics such as voltage, current, amplitude, frequency, or other measurable parameters, and the conditions may be different levels of temperature. For illustrative purposes, the output values may be the voltage of the output signals of the characteristic adjustable circuit 114 respectively corresponding to different trim settings, and the current condition may be a low temperature operating condition. A trimming result generally adds to or subtracts from a measurement in order to ensure that an electronic circuit delivers the performance as promised in its stated specification. The trimming is commonly done with a series of bits, as known as a trim code. The trim settings in the present exemplary embodiment may be multiple trim codes indicating different boosting ratios, where the maximum and the minimum boosting ratios may be set according to the physical and electrical characteristics of the characteristic adjustable circuit 114, and the number of bits used for trimming would depend on the desired trimming precision. For example, a 4-bit trim code would permit 16 different trim settings.

Next, the tester 110 would collect the output values from the characteristic outputting circuit 112 and calculate a statistical parameter associated with the output values of the current condition based on a parametric model function (Step S204). Herein, the parametric model function is associated with physical and electrical characteristics of the characteristic adjustable circuit 114. The tester 110 may fit the output values and the trim settings with the parametric model function to determine one or more parameters of the parametric model function and set the parameters as the statistical parameter. For example, when the characteristic adjustable circuit 114 is a bandgap circuit, a linear regression function may describe the relationship between output voltages and voltage-boosting ratios, and a slope and an intercept determined through model fitting would be considered as the statistical parameter. It is appreciated that those skilled in the art would exploit such concept to a further extent. For example, when the parametric model function is a polynomial regression function, the statistical parameter would be a set of more than two coefficients depending on the degree of the polynomial, and when the parametric model function is an exponential function, the statistical parameter would be a rate parameter. With a given parametric model function, a statistical parameter is sufficient to describe the data dependency between all the output values and the trimming settings.

Once the statistical parameter of the current condition is determined, the tester 110 would determine whether the current condition is the final condition (Step S206). In other words, the tester 110 would determine if the characteristic adjustable circuit 114 has been tested under all the conditions. If the current condition is not the final condition, the tester 110 would write the statistical parameter into the data memory 116 for storage (Step S208), and the flow would return to Step S202 to start another iteration under the next condition, e.g. a high temperature operating condition.

On the other hand, if the current condition is the final condition, there is no necessity to store the statistical parameter into the data memory 116. The tester 110 would directly use the statistical parameter of the final operation condition as well as the statistics parameters of the previous conditions read from the data memory 116 to determine an optimal trim setting of the characteristic adjustable circuit 114 according to the statistical parameters (Step S210). It should be noted that, in an exemplary embodiment, Step S206 may be omitted, and the tester 110 may still write the final condition into the data memory 116 before determining the optimal trim setting of the characteristic adjustable circuit 114. The disclosure is not limited in this regard.

The optimal trim setting of the characteristic adjustable circuit 114 may be determined based on an intersection of the parametric model functions with the statistical parameters corresponding to all the conditions. Note that when there exists more than one intersected points of any two or more parametric model functions, a center point of the intersected points, for example, may be considered as the intersection. Such intersection would represent a scenario where the output voltages irrespective of different conditions, where the trim setting corresponding to the intersection would be the optimal trim setting of the characteristic adjustable circuit 114. Once the optimal trim setting is determined, the tester 110 would write the optimal trim setting into the trim memory 118 (Step S212).

Figure 3:
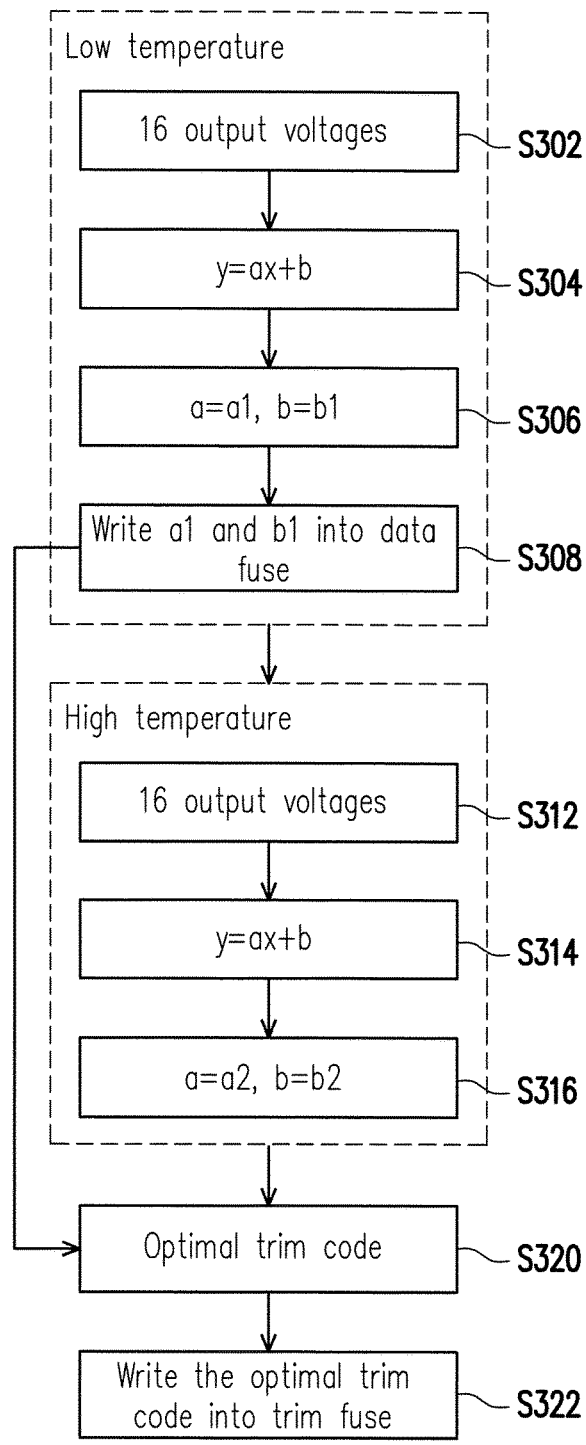
FIG. 3 illustrates a flowchart of a proposed trimming method for a bandgap circuit in accordance with one of the exemplary embodiments of the disclosure.

For better comprehension of the proposed method, FIG. 3 illustrates a flowchart of a proposed trimming method for a bandgap circuit in accordance with one of the exemplary embodiments of the disclosure. Herein, the characteristic adjustable circuit 114, the data memory 116, and the trim memory 118 in FIG. 1 may be implemented as a bandgap circuit, a data fuse, and a trim fuse in the present exemplary embodiment. The bandgap circuit would be tested under a low temperature operating condition and a high temperature operating condition.

Referring to FIG. 3, in low temperature, 16 output voltages corresponding to different trim codes would be received from the bandgap circuit (Step S302). Based on the physical and electrical characteristics of the bandgap circuit, the 16 output voltages respectively corresponding to 16 different trim codes may be fitted by a linear regression function y=ax+b (Step S304), where a and b respectively denote the slope and the intercept of the linear regression function. After model fitting, a=a1 and b=b1 would be obtained (Step S306) and burned into the data fuse (Step S308).

Next, in high temperature, another 16 output voltages corresponding to different trim codes would be received from the bandgap circuit (Step S312) and fitted by the linear regression function y=ax+b (Step S314). After model fitting, a=a2 and b=b2 would be obtained (Step S316). Next, a=a1 and b=b1 read from the data fuse along with a=a2 and b=b2 would be used to determine an optimal trim code (Step S320).

In other words, after the 16 output voltages $V_{bandgap}$ corresponding to different trim codes trim_code received under low temperature are fitted into a general linear regression model represented by Eq(1), Eq.(1.1) would be obtained, $$V_{bandgap}=a\times(\text{trim\_code})+b \quad \text{Eq.(1)}$$

$$V_{bandgap}=a1\times(\text{trim\_code})+b1 \quad \text{Eq.(1.1)}$$

and as for those received under high temperature, Eq.(1.2) would be obtained, $$V_{bandgap}=a2\times(\text{trim\_code})+b2 \quad \text{Eq.(1.2)}$$

In this case, the memory usage would be downsized, where only two pieces of data (a1 and b1) would be burned into the data fuse instead of all the 16 output voltages for 4-bit trim code. Evidently, for 5-bit trim code which allows 32 different operating settings with higher precision, still only two pieces of data would be burned into the data fuse instead of 32 output voltages. The intersection of Eq.(1) and Eq.(2) would may be denoted as ($V_{bandgap}$=V0, trim_code=TC0), where TC0 would be the optimal trim code and burned into the trim fuse.

Figure 4:
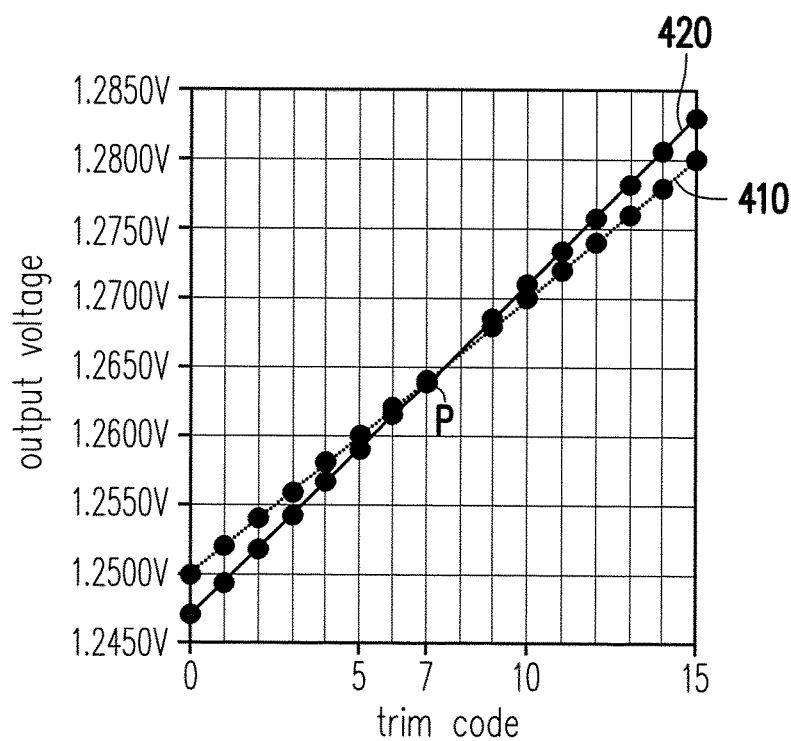
FIG. 4 illustrates a schematic diagram of detei inning an optimal trim code of a bandgap circuit in accordance with one of the exemplary embodiments of the disclosure.

Graphically speaking, FIG. 4 illustrates a schematic diagram of determining an optimal trim code of a bandgap circuit in accordance with one of the exemplary embodiments of the disclosure.

Referring to FIG. 4, the 16 output voltages received under low temperature may be fitted by a line 410 with Eq.(1.1), and the 16 output voltages received under high temperature may be fitted by a line 420 with Eq.(1.2). Only the intercept and the slope of the line 410 would be burned into the data fuse. A point P represents the intersection of the line 410 and the line 420, where the trim code corresponding to the point P (i.e. trim_code=7) would be the optimal trim code and burned into the trim fuse.

It should be noted that, the characteristic adjustable circuit 114 may also be tested under different manufacturing variations, where such variations may be introduced when the execution of steps changes. For example, in terms of manufacturing variations for a bandgap circuit, the slope and the intercept of the linear regression function would be shifted with a certain correlation. That is, the original linear regression function in Eq.(1) may be rewritten as follows, $$V_{bandgap}=\lfloor C_{intercept}\times S_{intercept}+N_{intercept}\rfloor+\lfloor(C_{intercept}+\Delta)\times S_{slope}+N_{slope}\rfloor\times\text{trim\_code}$$

where $C_{intercept}$ denotes an intercept and may be a positive or negative integer, $S_{intercept}$ denotes an increment of the intercept per step and may be a constant, $N_{intercept}$ denotes the center of the intercepts and may be a constant, $\Delta$ denotes an adjustment on $C_{slope}$ with respect to $C_{intercept}$ and may be a positive or negative integer, $S_{slope}$ represent an increment of the slope and may be a constant, and $N_{slope}$ denotes the center of the slopes and may be a constant. Since the slopes and the intercepts under different manufacturing variations are highly correlated, $\Delta$ may be recorded with less fuse usage.

In view of the aforementioned descriptions, the disclosure provides a trimming technique for ICs which allows an optimal trim setting across a wide range of operating conditions to be determined with minimal memory usage.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A trimming method, applicable to a trimming system comprising a characteristic adjustable circuit, a tester, and a trimming circuitry coupled to the characteristic adjustable circuit and the tester, wherein the trimming circuitry comprises a characteristic outputting circuit, a data memory, and a trim memory, and wherein the method comprises the following steps:

under each of a plurality of conditions, outputting a plurality of output signals respectively corresponding to a plurality of trim settings from the characteristic adjustable circuit by the characteristic outputting circuit to obtain a plurality of output values of the corresponding condition, calculating a statistical parameter of a parametric model function associated with the output values of the corresponding condition by the tester comprising:
fitting the output values and the trim settings with the parametric model function to determine at least one parameter of the parametric model function; and
setting the at least one parameter as the statistical parameter;
writing the statistical parameter of at least one of the conditions into the data memory by the tester;
determining an optimal trim setting of the characteristic adjustable circuit according to the statistical parameters under all the conditions by the tester; and
writing the optimal trim setting into the trim memory by the tester.

2. The method according to claim 1, wherein under each of the conditions, before the step of calculating the statistical parameter of the parametric model function associated with the output values of the corresponding condition by the tester, the method further comprises:
obtaining the parametric model function by the tester, wherein the parametric model function is associated with physical and electrical characteristics of the characteristic adjustable circuit.

3. The method according to claim 2, wherein the step of determining the optimal trim setting of the characteristic adjustable circuit according to the statistical parameters based on the parametric model function by the tester comprises:
determining an intersection of the parametric model functions with the statistical parameters under all the conditions by the tester; and
setting a trim setting corresponding to the intersection as the optimal trim setting by the tester.

4. The method according to claim 2, wherein the characteristic adjustable circuit is a bandgap circuit, wherein the parametric model function of each of the conditions is a linear regression function, and wherein the statistical parameter of each of the conditions comprises a slope and an intercept.

5. The method according to claim 1, wherein the conditions are different levels of temperature.

6. The method according to claim 1, wherein the conditions are different manufacturing variations of the characteristic adjustable circuit.

7. The method according to claim 6, wherein the statistical parameters of all the conditions have a correlation, and wherein the step of writing the statistical parameter of the at least one of the conditions into the data memory by the tester comprises: writing the statistical parameter of the at least one of the conditions and the correlation into the data memory.

8. The method according to claim 1, wherein the data memory is a one-time programmable non-volatile memory component.

9. A trimming system comprising:
a tester; and
a trimming circuitry coupled to a characteristic adjustable circuit and the tester and comprising a characteristic outputting circuit, a data memory, and a trim memory,
wherein under each of a plurality of conditions, the characteristic outputting circuit receives a plurality of output signals respectively corresponding to a plurality of trim settings from the characteristic adjustable circuit to obtain a plurality of output values of the corresponding condition, and the tester calculates a statistical parameter of a parametric model function associated with the output values of the corresponding condition by fitting the output values and the trim settings with the parametric model function to determine at least one parameter of the parametric model function and setting the at least one parameter as the statistical parameter,
wherein the tester writes the statistical parameter of at least one of the conditions into the data memory, and
wherein the tester determines an optimal trim setting of the characteristic adjustable circuit according to the statistical parameters under all the conditions and writes the optimal trim setting into the trim memory.

10. The trimming system according to claim 9, wherein under each of the conditions, the tester fits the output values and the trim settings with the parametric model function associated with physical and electrical characteristics of the characteristic adjustable circuit to determine at least one parameter of the parametric model function and sets the at least one parameter as the statistical parameter, and wherein the tester determines an intersection of the parametric model functions with the statistical parameters of all the conditions and sets a trim setting corresponding to the intersection as the optimal trim setting.

11. The trimming system according to claim 9, wherein the conditions are different levels of temperature.

12. The trimming system according to claim 9, wherein the conditions are different manufacturing variations of the characteristic adjustable circuit.

13. The method according to claim 12, wherein the statistical parameters of all the conditions have a correlation, and wherein the tester writes the statistical parameter of the at least one of the conditions and the correlation into the data memory.

14. A trimming circuitry, coupled to a characteristic adjustable circuit and a tester and comprising:
a characteristic outputting circuit;
a data memory; and
a trim memory,
wherein under each of a plurality of conditions, the characteristic outputting circuit receives a plurality of output signals respectively corresponding to a plurality of trim settings from the characteristic adjustable circuit to obtain a plurality of output values of the corresponding condition, and the data memory is written a statistical parameter of at least one of the conditions by the tester, wherein the statistical parameter of each of the conditions is a parameter of a parametric model function associated with the output values of the corresponding condition by fitting the output values and the trim settings with the parametric model function to determine at least one parameter of the parametric model function and setting the at least one parameter as the statistical parameter, and
wherein the trim memory is written an optimal trim setting of the characteristic adjustable circuit according to the statistical parameters under all the conditions by the tester.

15. The trimming circuitry according to claim 14, wherein the conditions are different levels of temperature.

16. The trimming circuitry according to claim 14, wherein the parametric model function is associated with physical and electrical characteristics of the characteristic adjustable circuit.

17. The trimming circuitry according to claim 16, wherein the characteristic adjustable circuit is a bandgap circuit, wherein the parametric model function of each of the conditions is a linear regression function, and wherein the statistical parameter of each of the conditions comprises a slope and an intercept.

18. The trimming circuitry according to claim 14, wherein the conditions are different manufacturing variations of the characteristic adjustable circuit, wherein the statistical parameters of all the conditions have a correlation, and wherein the data memory is written the statistical parameter of the at least one of the conditions and the correlation.

19. The trimming circuitry according to claim 14, wherein the data memory is a one-time programmable non-volatile memory component.

* * * * *